(12) United States Patent
Wakuda et al.

(10) Patent No.: US 10,468,364 B2
(45) Date of Patent: Nov. 5, 2019

(54) PLATING METHOD

(71) Applicant: EBARA CORPORATION, Tokyo (JP)

(72) Inventors: Yohei Wakuda, Tokyo (JP); Yasuyuki Masuda, Tokyo (JP); Masahi Shimoyama, Tokyo (JP)

(73) Assignee: EBARA CORPORATION, Tokyo (JP)

(*) Notice: Subject to any disclaimer, the term of this patent is extended or adjusted under 35 U.S.C. 154(b) by 0 days.

(21) Appl. No.: 15/466,282

(22) Filed: Mar. 22, 2017

(65) Prior Publication Data
US 2017/0278813 A1    Sep. 28, 2017

(30) Foreign Application Priority Data

Mar. 28, 2016    (JP) .................. 2016-063760

(51) Int. Cl.
C25D 5/02 (2006.01)
H01L 23/00 (2006.01)
(Continued)

(52) U.S. Cl.
CPC .............. H01L 24/11 (2013.01); C25D 3/38 (2013.01); C25D 5/02 (2013.01); C25D 5/54 (2013.01); C25D 7/12 (2013.01); C25D 21/10 (2013.01); H01L 24/94 (2013.01); H01L 24/13 (2013.01); H01L 2224/119 (2013.01); H01L 2224/11462 (2013.01); H01L 2224/13147 (2013.01)

(58) Field of Classification Search
None
See application file for complete search history.

(56) References Cited

U.S. PATENT DOCUMENTS

2007/0215479 A1* 9/2007 Dow .................. C25D 3/38
205/118
2007/0235343 A1 10/2007 Watkowski et al.
(Continued)

FOREIGN PATENT DOCUMENTS

JP    2006-131961 A    5/2006
JP    2009-155726 A    7/2009
(Continued)

OTHER PUBLICATIONS

Chen, Wei-Chih, et al., "Bump Shape Prediction of Cu Pillar via an Electrochemical Method", ECS Transactions, 52, (1), 452-460, 2013.*
(Continued)

*Primary Examiner* — Stefanie S Wittenberg
(74) *Attorney, Agent, or Firm* — Baker & Hostetler LLP

(57) ABSTRACT

A plating method which can achieve a desired dome height is disclosed. The method includes: preparing correlation data showing a relationship between proportion of dome height to bump height and concentration of chloride ions; producing a plating solution containing chloride ions at a concentration which has been selected based on a desired proportion of dome height to bump height and on the correlation data, the selected concentration being in a range of 100 mg/dm$^3$ to 300 mg/dm$^3$; immersing a substrate in the plating solution; and passing an electric current between an anode and the substrate, both immersed in the plating solution, thereby plating the substrate to form bumps.

7 Claims, 12 Drawing Sheets

(51) Int. Cl.
*C25D 3/38* (2006.01)
*C25D 5/54* (2006.01)
*C25D 7/12* (2006.01)
*C25D 21/10* (2006.01)

(56) References Cited

U.S. PATENT DOCUMENTS

| 2011/0174630 | A1* | 7/2011 | Kojima | C25D 3/38 |
| | | | | 205/186 |
| 2015/0315720 | A1* | 11/2015 | Mayer | C25D 21/18 |
| | | | | 204/241 |
| 2016/0053394 | A1* | 2/2016 | Takahashi | C08G 69/26 |
| | | | | 205/296 |
| 2016/0102416 | A1* | 4/2016 | Zhou | C25D 7/123 |
| | | | | 205/123 |

FOREIGN PATENT DOCUMENTS

| JP | 2009-532586 A | 9/2009 |
| JP | 2010-255078 A | 11/2010 |
| JP | 2011-054890 A | 3/2011 |

OTHER PUBLICATIONS

Dow, Wei-Ping, et al., "Roles of Chloride Ion in Microvia Filling by Copper Electrodeposition", JES, 152, (2), C67-C76, 2005.*
Kao, Y.L., et al., "Microstructural Study of the Effect of Chloride Ion on Electroplating Copper in Cupric Sulfate-Sulfuric Acid Bath", JES, 152 (9), C605-C611, 2005.*
Huang, H-C., et al., "Influence of Convection-Dependent Adsorption of Additives on Microvia Filling by Copper Electroplating", JES, 152, (6), C425-C434, 2005.*
Denda; "Higher-Dimensional Semiconductor Technology, 3D/2.5/2.1D Packaging Using Through-Silicon Vias"; Tokyo Denki University Press; p. 16-18 (partial translation).

* cited by examiner

PLATING METHOD

CROSS REFERENCE TO RELATED APPLICATION

This document claims priority to Japanese Patent Application Number 2016-063760 filed Mar. 28, 2016, the entire contents of which are hereby incorporated by reference.

BACKGROUND

Bumps are formed on a surface of a wafer having integrated circuits, such as LSIs. Such bumps constitute a part of interconnects of an integrated circuit, and serve as terminals for connection to a circuit of an external package substrate (or a circuit substrate). The bumps are generally disposed along a periphery of a semiconductor chip (or die), and are connected to an external circuit by gold wires according to a wire bonding method or by leads according to a TAB method.

With the recent progress toward higher integration and higher density of semiconductor devices, the number of bumps for connection to external circuits is increasing, giving rise to the necessity to form bumps over the entire area of the surface of a semiconductor chip. Further, the need for shorter interconnect spacing has led to the use of a method (flip chip method) which involves flipping a semiconductor chip having a large number of bumps formed on its surface, and connecting the bumps directly to a circuit substrate.

Gold, silver, copper, nickel, solder, indium, or an alloy species comprising at least one of these metals is used as a bump material. Of these bump materials, solder is electrically conductive and has a relatively low melting point, and thus can be melted to bond elements at a temperature that does not cause damage to an electrical interconnect material or a semiconductor material. Therefore, solder is widely used to connect electrodes of a semiconductor chip to electrodes of a package substrate.

Electroplating is widely employed as a method of forming bumps. A process of forming bumps on a surface of a wafer having integrated circuits is one of the most important processes in a final stage of manufacturing of a semiconductor device. It is to be noted in this regard that an integrated circuit is formed on a wafer through many manufacturing processes. Therefore, very high reliability is required for a bump forming process which is performed on a wafer that has passed all the preceding processes. With the progress toward smaller-sized semiconductor chips, the number of bumps for connection to external circuits is increasing and bumps themselves are becoming smaller-sized. Accordingly, a need exists to enhance the accuracy of positioning for bonding of a semiconductor chip to a circuit substrate such as a package substrate. In addition, there is a strong demand for no defect being produced in a bonding process in which bumps are melted and solidified.

Copper bumps are formed on a seed layer of a wafer which is electrically connected to integrated circuits. A resist having openings is formed on the seed layer, and copper is deposited by copper plating on the exposed surface of the seed layer in the openings to thereby form copper bumps. The seed layer comprises a barrier layer, e.g. composed of titanium, and a feed layer, e.g. composed of copper. The barrier layer serves to prevent diffusion of copper which is a bump metal, while the feed layer serves to feed electricity to the wafer for electroplating. Thus, besides the function as a feed film for electroplating, the seed layer functions as a metal film for preventing diffusion of copper which is a bump metal. After filling the openings of the resist with copper, the resist is removed, and then the copper bumps are subjected to reflow processing.

FIG. 13 is a cross-sectional view of a bump after the plating process and before the reflow process. A bump height H is a distance from a bottom to a top of a bump 1. When the bump 1 is formed by plating in an opening of a resist, a dome 2 is formed at the top portion of the bump 1. This dome 2 is the top portion having an inwardly curved side surface. In FIG. 13, a dome height is represented by dh. The bump height H is preferably not less than 10 μm in order to ensure a uniform height of bumps bonded to a circuit substrate.

In a semiconductor device manufacturing process which involves formation of TSVs, a via-middle metal exposing technique which comprises polishing and planarizing an entire surface of a wafer, containing head portions of vias formed by copper plating, with a CMP apparatus before performing reflow processing, and then performing chemical etching to expose the head portions of the vias, followed by the production of bumps, has recently been proposed under development of a 2.5-dimensional packaging technology (Seiichi Denda, "Higher-Dimensional Semiconductor Technology, 3D/2.5D/2.1D Packaging Using Through-Silicon Vias", Tokyo Denki University Press, pp. 16-18).

It has recently been found through studies of such a packaging technology that a height of a via head, i.e. the dome height dh of a copper bump formed by plating, is preferably made as low as possible. If the dome height dh of the bump is low, a time required for a polishing process, which is to be performed after plating, can be shortened. However, the dome height dh depends largely on the bump height H; therefore, it is difficult to control the dome height dh independently of the bump height H. Further, the required dome height dh may vary depending on conditions of subsequent processing. Under such a situation, there is a demand for a technique which can control the dome height dh without depending on the bump height H.

SUMMARY OF THE INVENTION

According to an embodiment, there is provided a plating method which can achieve a desired dome height.

Embodiments, which will be described below, relate to a plating method for forming bumps on a substrate, and more particularly to a copper plating method capable of controlling the shape of bumps.

In one embodiment, there is provided a method of plating a substrate with copper to form bumps, comprising: preparing correlation data showing a relationship between proportion of dome height to bump height and concentration of chloride ions; producing a plating solution containing chloride ions at a concentration which has been selected based on a desired proportion of dome height to bump height and on the correlation data, the selected concentration being in a range of 100 mg/dm$^3$ to 300 mg/dm$^3$; immersing a substrate in the plating solution; and passing an electric current between an anode and the substrate, both immersed in the plating solution, thereby plating the substrate to form bumps.

In one embodiment, plating of the substrate is performed until a height of the bumps reaches at least 100 μm.

In one embodiment, a current density is increased at a start of plating of the substrate.

In one embodiment, the current density is in a range of 1 A/dm$^2$ to 20 A/dm$^2$.

In one embodiment, a temperature of the plating solution is maintained in a range of 30° C. to 80° C. during plating of the substrate.

In one embodiment, the plating solution is agitated by reciprocating a paddle in the plating solution at a reciprocating speed of 100 times/min to 500 times/min during plating of the substrate.

According to the above-described embodiments, the use of the plating solution, containing chloride ions at a concentration determined based on the correlation data, can achieve a desired dome height even when the height of the bumps is high (for example, not less than 100 μm).

DESCRIPTION OF EMBODIMENTS

Figure 1:
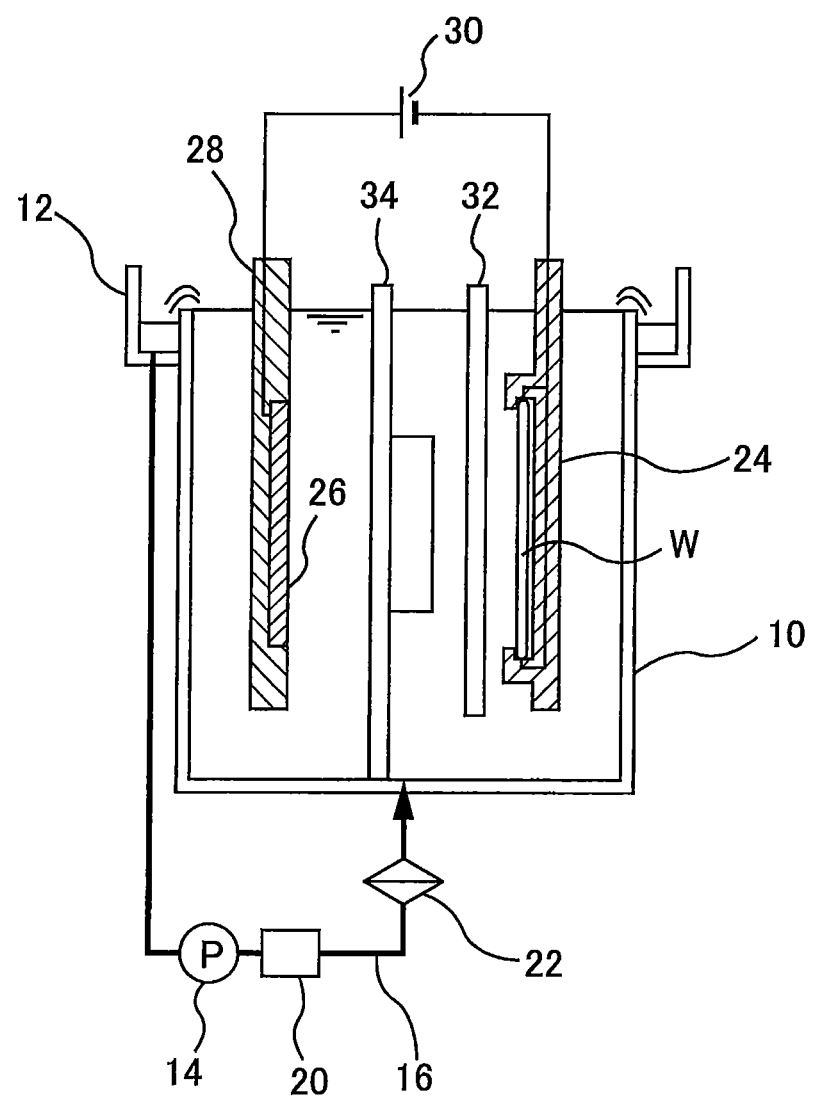
FIG. 1 is a vertical cross-sectional front view of an embodiment of a plating apparatus.

FIG. 1 is a vertical cross-sectional front view of an embodiment of a plating apparatus. The plating apparatus of this embodiment is a copper plating apparatus which can deposit copper on a surface of a substrate, such as a wafer having integrated circuits. As shown in FIG. 1, the plating apparatus includes a plating tank 10 for holding a plating solution therein. The plating tank 10, at its upper portion, is provided with an overflow tank 12 for receiving the plating solution that has overflowed a top edge of the plating tank 10. The plating solution for use in this embodiment contains copper ions and sulfate ions, and further contains additives, such as an accelerator and a suppressor.

One end of a plating-solution supply line 16, which is provided with a pump 14, is coupled to the bottom of the overflow tank 12, while the other end of the plating-solution supply line 16 is coupled to the bottom of the plating tank 10. The plating solution that has been collected in the overflow tank 12 is returned through the plating-solution supply line 16 to the plating tank 10 by the actuation of the pump 14. A temperature regulator 20 for regulating the temperature of the plating solution, and a filter 22 for removing foreign matters in the plating solution, both located downstream of the pump 14, are attached to the plating-solution supply line 16.

The plating apparatus includes a substrate holder 24 for removably holding a substrate W (an object to be plated), such as a wafer, and immersing the substrate W in a vertical position in the plating solution held in the plating tank 10. The plating apparatus further includes an anode 26 disposed in the plating tank 10, and an anode holder 28 holding the anode 26. When the substrate holder 24, holding the substrate W, is set in the plating tank 10, the substrate W and the anode 26 are opposite each other in the plating tank 10. In this embodiment, phosphorus-containing copper is used as a material of the anode 26. The anode 26 is electrically connected to a positive electrode of a power source 30, and the substrate W is coupled via the substrate holder 24 to a negative electrode of the power source 30. A metal (copper) is deposited on the surface of the substrate W by passing an electric current from the power source 30 between the anode 26 and the substrate W.

A paddle 32, which reciprocates parallel to the surface of the substrate W to agitate the plating solution, is disposed between the substrate W, held by the substrate holder 24, and the anode 26. By agitating the plating solution with the paddle 32, a sufficient amount of copper ions can be supplied uniformly to the surface of the substrate W. A reciprocating speed (i.e., the number of reciprocations per minute) of the paddle 32 during plating of the substrate W is in a range of 100 times/min to 500 times/min. A distance between the paddle 32 and the substrate W may be in a range of 5 mm to 11 mm. A regulation plate 34, which is made of a dielectric material, for making the distribution of electric potential more uniform over the entire surface of the substrate W is disposed between the paddle 32 and the anode 26.

Figure 2:
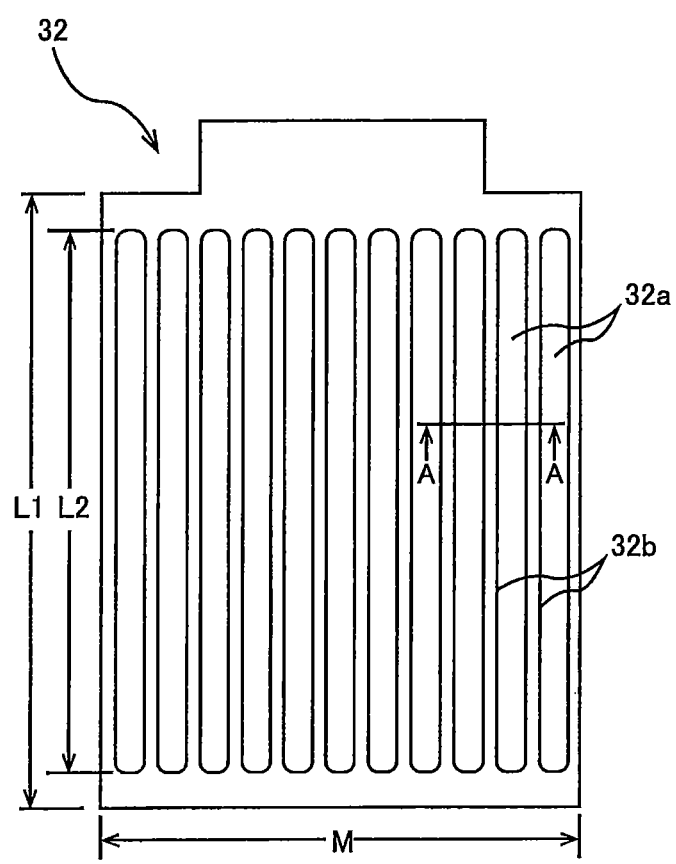
FIG. 2 is a front view of a paddle.
Figure 3:
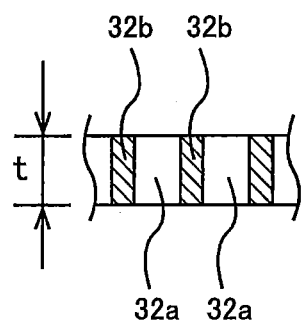
FIG. 3 is a cross-sectional view taken along a line A-A of FIG. 2.

As shown in FIGS. 2 and 3, the paddle 32 is comprised of a rectangular plate having a constant thickness t in a range of 3 mm to 5 mm and having a plurality of vertically-extending strip-shaped portions 32b. A plurality of parallel elongated holes 32a, each of which is interposed between adjacent two of the strip-shaped portions 32b, are formed in the paddle 32. The paddle 32 is, for example, made of titanium coated with Teflon (registered trademark). A vertical length L1 of the paddle 32 and a longitudinal dimension L2 of each elongated hole 32a are set to be sufficiently larger than a vertical dimension of the substrate W. Further, a lateral length M of the paddle 32 is set to be sufficiently larger than a lateral dimension of the substrate W so that when the paddle 32 reciprocates, both side ends of the paddle 32 lie outside the substrate W. It is noted that the present invention is not limited to paddle agitation as in this embodiment and other agitation mechanisms, such as air agitation, jet flow agitation, squeegee agitation, etc., may be used.

During plating of the substrate W, the temperature regulator 20 maintains the plating solution at a predetermined temperature selected from a range of 30° C. to 80° C. It is noted that the present invention is not limited to the temperature regulator 20, and other plating-solution temperature control system may be used. For example, it is possible to provide a temperature sensor in the plating tank 10, and to install a heater (or chiller) and a heat exchanger (or cooler) on a plating-solution pipe line for circulating the plating solution between the plating tank 10 and a plating-solution replenishment unit. Such a temperature control system can heat or cool the plating solution in the pipe line in accordance with the temperature of the plating solution in the plating tank 10, thereby feeding the plating solution having a controlled temperature into the plating tank 10.

There is no particular limitation on an accelerator for use in the plating solution. Examples of usable accelerators include SPS (bis(3-sulfopropyl) disulfide) or its disodium salt, 3-methyl-1-propanesulfonic acid or its sodium salt, N,N-dimethyldithiocarbamic acid (3-sulfopropyl) disulfide, etc.

There is no particular limitation on a suppressor for use in the plating solution. Examples of usable suppressors include PEG (polyethylene glycol), polypropylene glycol, a copolymer of ethylene glycol and propylene glycol, and their derivatives, polyvinyl alcohol, carboxymethyl cellulose, etc.

The plating solution may contain a leveler as an additive. There is no particular limitation on the leveler. Examples of usable levelers include PEI (polyethylene imine), an organic dye such as Janus green B, a reaction product of a diglycidyl ether and a nitrogen-containing compound, a polyamine, a water-soluble resin, etc.

Figure 13:
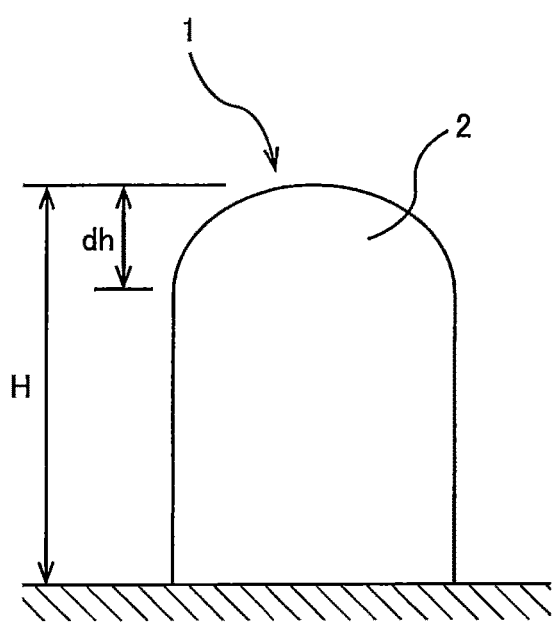
FIG. 13 is a cross-sectional view of a bump after a plating process and before a reflow process.

The plating solution for use in this embodiment contains chloride ions ($Cl^-$) in addition to the above additives. It is recognized that chloride ions are adsorbed onto the surface of copper that has been deposited by plating to thereby exhibit their function. More specifically, it is recognized that chloride ions act on the suppressor in the plating solution to promote the function of the suppressor. It has been found experimentally by the inventors that a dome height (see FIG. 13) of bumps formed by plating varies depending on a chloride ion concentration in the plating solution.

Figure 4:
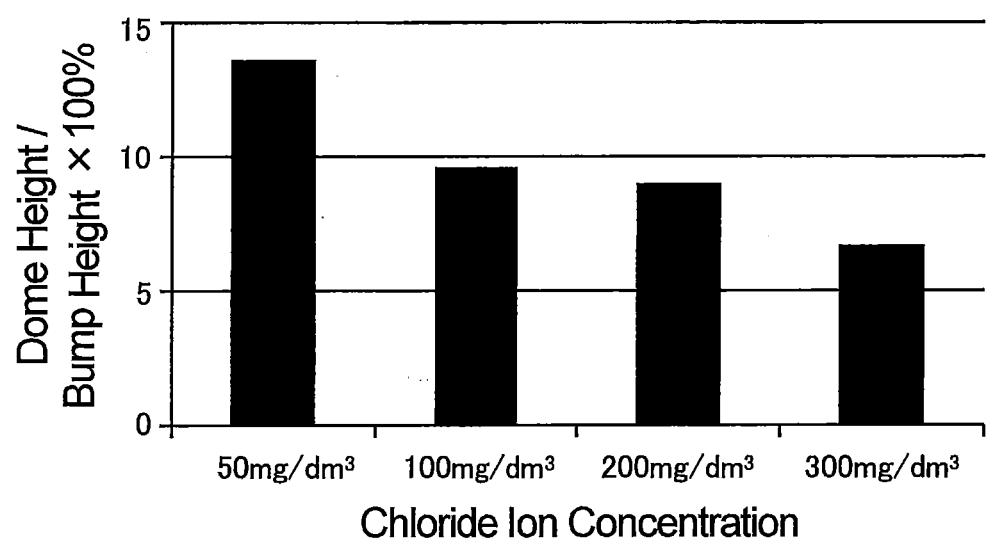
FIG. 4 is a graph showing a relationship between chloride ion concentration in a plating solution and proportion of dome height to bump height.

FIG. 4 is a graph showing a relationship between chloride ion concentration in a plating solution and proportion of dome height to bump height. The proportion of dome height to bump height has the same meaning as a ratio of dome height to bump height. Graph of FIG. 4 shows results of an experiment in which bumps were formed under conditions that substrates were immersed in four plating solutions having different chloride ion concentrations.

The four plating solutions used in the experiment each contained copper sulfate pentahydrate, sulfuric acid, an accelerator, a suppressor, a leveler, and chloride ions. The chloride ion concentrations of the prepared plating solutions were 50 mg/dm$^3$ (or ppm), 100 mg/dm$^3$ (or ppm), 200 mg/dm$^3$ (or ppm), and 300 mg/dm$^3$ (or ppm). Plating conditions, other than the chloride ion concentration, were the same. As can be seen in FIG. 4, the proportion of dome height to bump height decreases with the chloride ion concentration.

Figure 5:
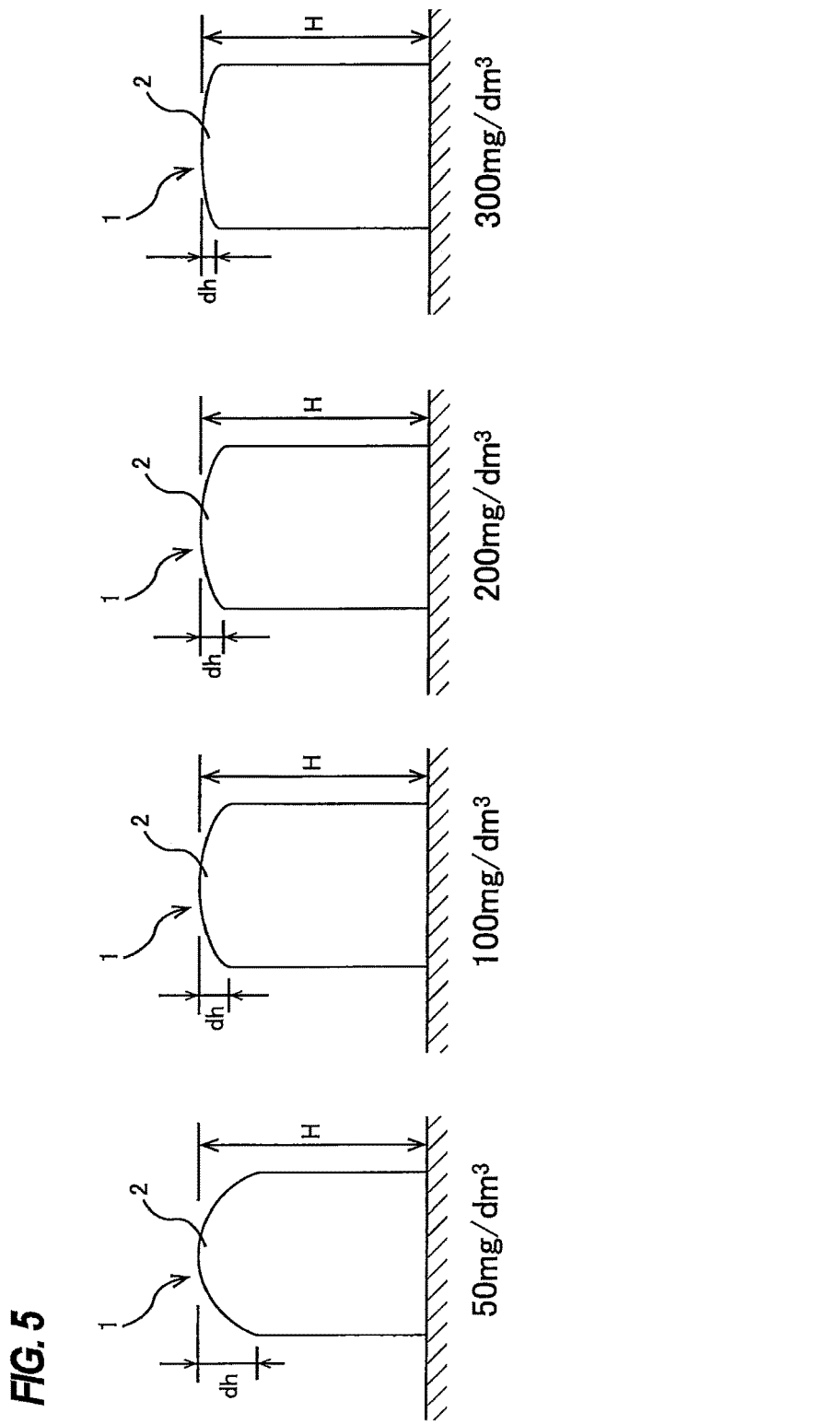
FIG. 5 is a diagram showing bump shapes obtained by plating substrates using plating solutions containing chloride ions at various concentrations shown in FIG. 4.

FIG. 5 is a diagram showing bump shapes obtained by plating the substrates using the plating solutions containing chloride ions at the various concentrations shown in FIG. 4. The heights of the four bumps 1 shown in FIG. 5, namely the bump heights H, were substantially equal. More specifically, the bump height H was not less than 100 μm. As can be seen in FIG. 5, the dome height dh decreases with the chloride ion concentration despite the fact that the bump heights H are substantially equal. This indicates that the higher the chloride ion concentration is, the lower is the dome height dh.

In general, when the bump height H is small, the dome height dh is also small, and therefore the shape of the dome is of little significance. However, since the dome height dh depends largely on the bump height H, the dome height dh becomes significantly large when the bump height H is as large as 100 μm or more. According to this embodiment, the dome height dh can be made small by adjusting the chloride ion concentration in the plating solution even when the bump height H is not less than 100 μm.

Chloride ions can be added to the plating solution by feeding water-soluble chlorine compound into the plating solution. The chloride ion concentration in the plating solution can therefore be adjusted by the amount of the water-soluble chlorine compound to be fed into the plating solution. Examples of usable water-soluble chlorine compounds include hydrochloric acid, sodium chloride, potassium chloride, and a combination thereof.

Figure 6:
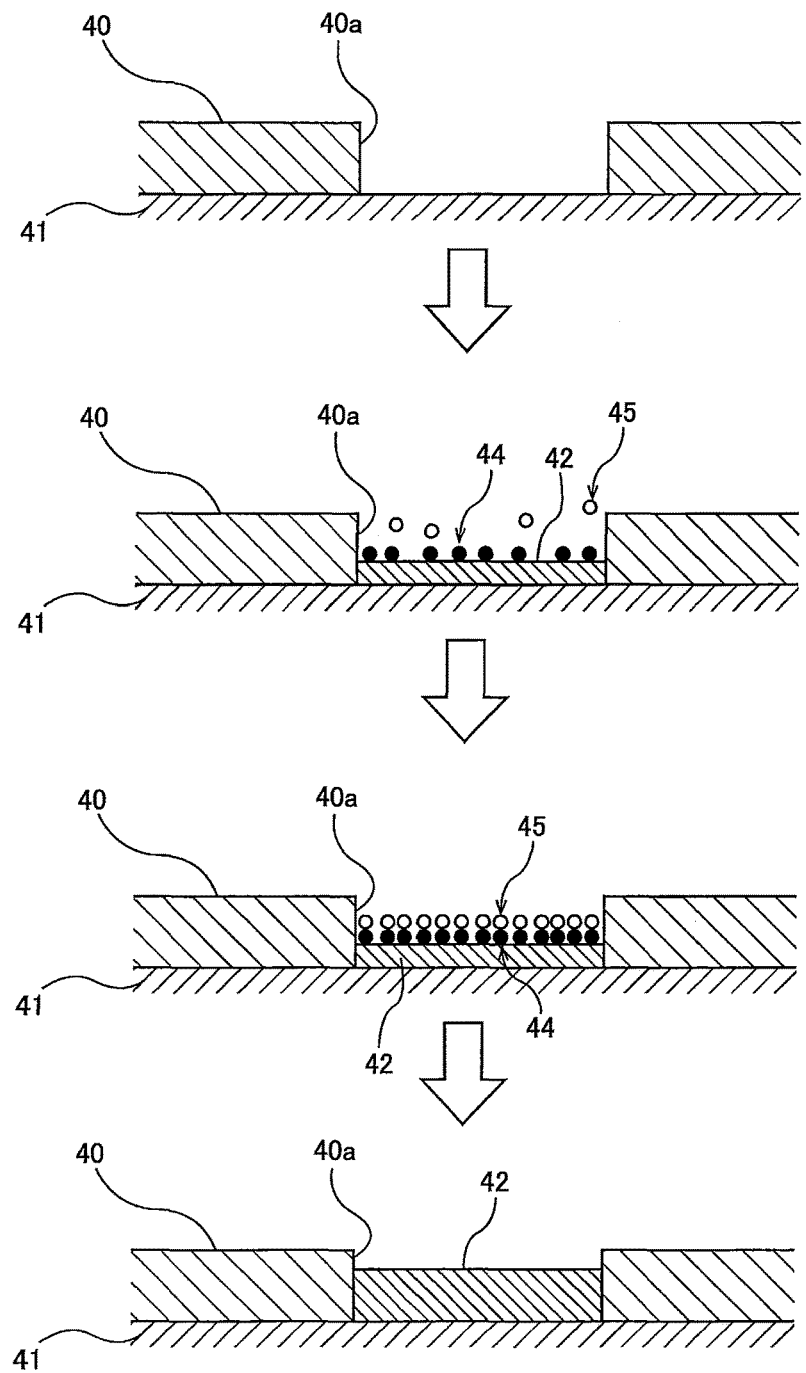
FIG. 6 is a diagram illustrating the action of chloride ions in a case of a high chloride ion concentration in a plating solution.

The followings are considered to be the reasons why the dome height varies with the chloride ion concentration: As shown in FIG. 6, copper 42 constituting a bump is deposited on an exposed surface of a seed layer 41 in an opening 40a of a resist 40. Chloride ions 44 are adsorbed onto the surface of the deposited copper 42. A suppressor 45 adheres to the surface of copper 42 with the adsorbed chloride ions 44 as an intermediary. This reduces local deposition of copper 42 and increases the density of nuclei generated. Chloride ions 44 especially affect the bottom-up growth of copper 42.

When the concentration of chloride ions 44 in the plating solution is high, chloride ions 44 uniformly adhere to the surface of copper 42, and the suppressor 45 adheres to the surface of copper 42 via the chloride ions 44 that have adhered, as shown in FIG. 6. As a result, local deposition of copper 42 is reduced, and a central portion of the surface of copper 42 is hardly raised.

Figure 7:
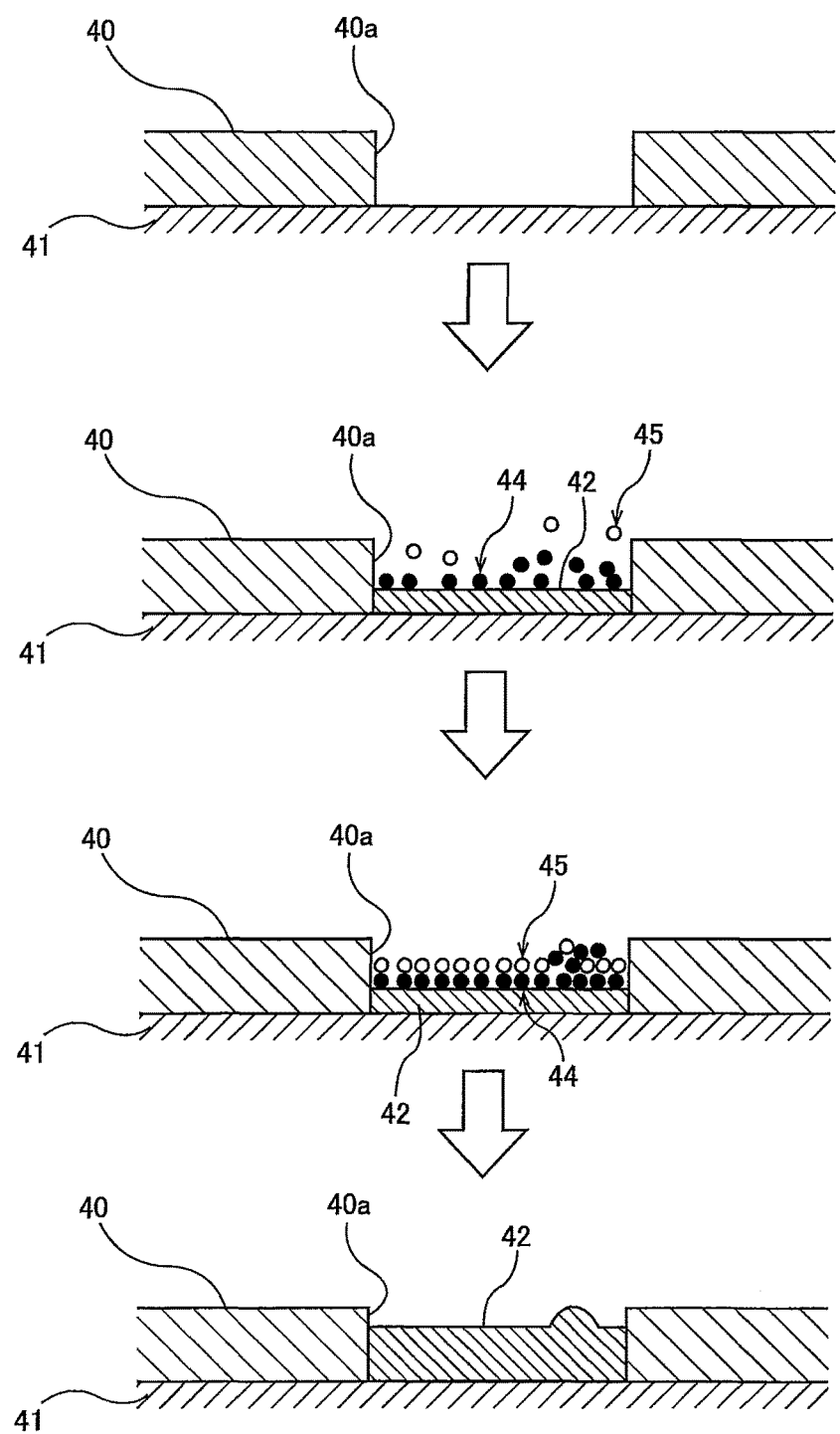
FIG. 7 is a diagram illustrating the action of chloride ions in a case of an excessively high chloride ion concentration in a plating solution.

When the concentration of chloride ions 44 in the plating solution is excessively high, chloride ions 44 exist excessively on a portion of the surface of copper 42, thus producing an electrically weak portion, as shown in FIG. 7. Electric current concentrates at that electrically weak portion, thus locally increasing the current density. As the plating progresses in this state, a recessed portion called a pit, or a protrusion (raised portion) called a nodule is formed on a part of the surface of copper 42.

Figure 8:
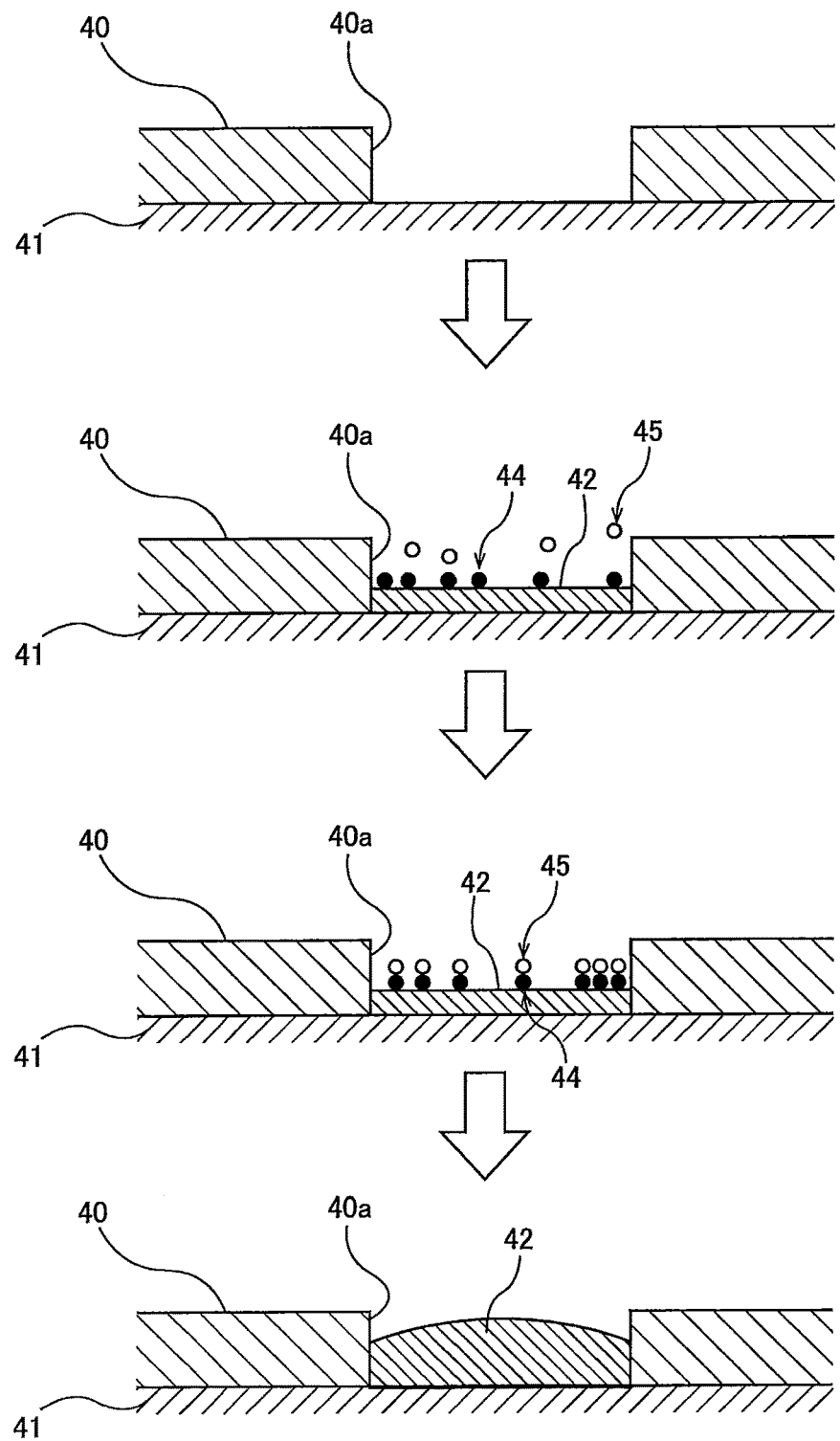
FIG. 8 is a diagram illustrating the action of chloride ions in a case of a low chloride ion concentration in a plating solution.

When the concentration of chloride ions 44 in the plating solution is low, on the other hand, chloride ions 44 do not uniformly adhere to the surface of copper 42 and tend to gather in the periphery of the surface of copper 42. As a result, a central portion of the surface of copper 42 is raised, as shown in FIG. 8.

In light of the above, there exists an appropriate range of chloride ion concentration for controlling the dome height. In this embodiment, the chloride ion concentration in the plating solution is selected from a range of 100 mg/dm$^3$ (or ppm) to 300 mg/dm$^3$ (or ppm). If the chloride ion concentration is less than 100 mg/dm$^3$, it is difficult to control the dome height because of a too small amount of chloride ions that act on the suppressor. If the chloride ion concentration is more than 300 mg/dm$^3$, on the other hand, a recessed portion called a pit, or a protrusion called a nodule will be formed on a portion of a bump, as described above with reference to FIG. 7. For these reasons, the chloride ion concentration of the plating solution to be used in bump plating according to this embodiment is in the range of 100 mg/dm$^3$ to 300 mg/dm$^3$.

Figure 9:
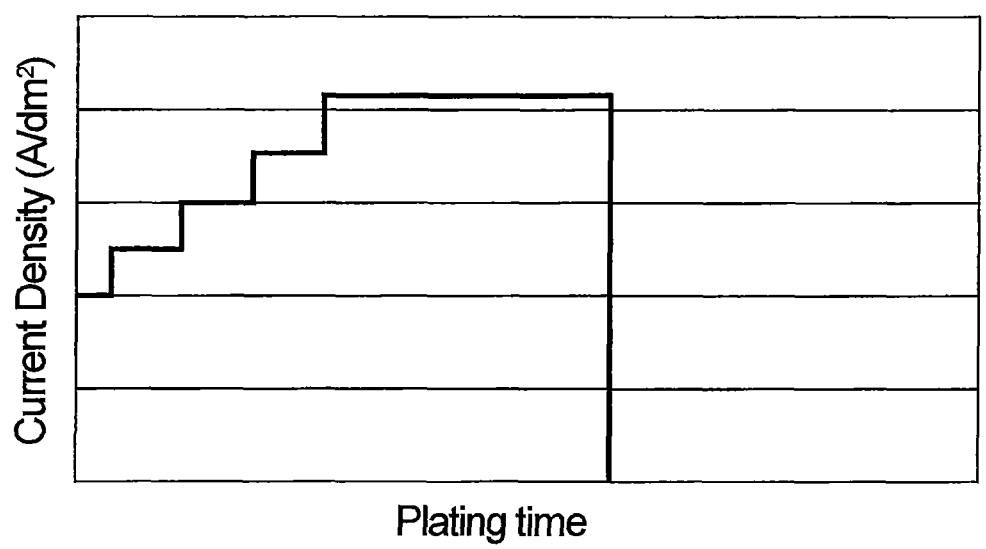
FIG. 9 is a diagram illustrating an embodiment in which current density is increased stepwise.
Figure 10:
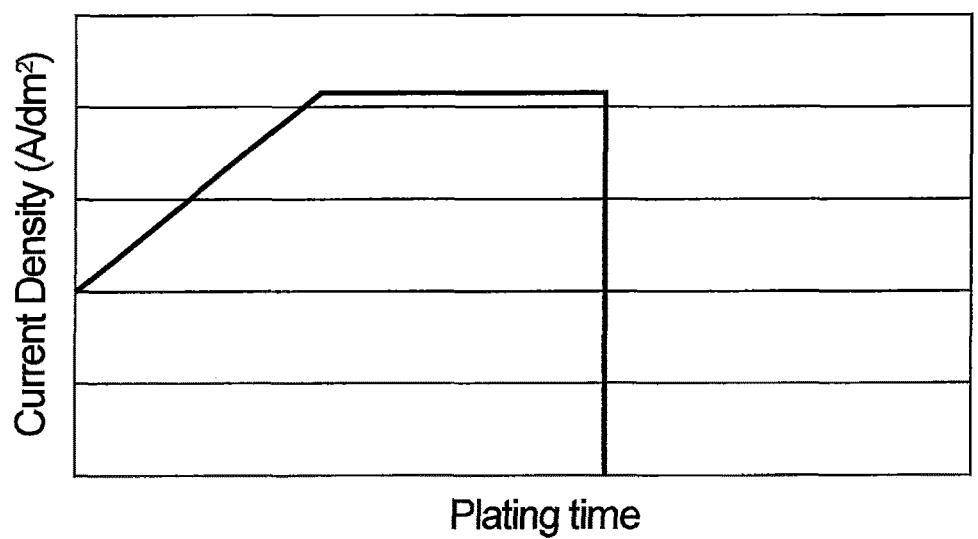
FIG. 10 is a diagram illustrating an embodiment in which current density is increased linearly.

In one embodiment, the current density is maintained in a range of 1 A/dm$^2$ to 20 A/dm$^2$ during plating of a substrate. In order to shorten the plating time and increase the throughput, the density of electric current flowing from the anode 26 (see FIG. 1) to the substrate W is preferably high. However, if the current density is set to be high from the beginning, irregularities can be formed on a portion of the surface of copper. Therefore, it is preferred to gradually increase the current density at the start of plating in order to shorten the plating time while preventing the formation of surface irregularities. FIG. 9 is a diagram illustrating an embodiment in which the current density is increased stepwise, and FIG. 10 is a diagram illustrating an embodiment in which the current density is increased linearly. By increasing the current density gradually at the start of plating as shown in FIGS. 9 and 10, the plating time can be shortened and the throughput can be improved without producing a defect. The phrase "at the start of plating" herein refers to a predetermined period of time, which may be short, from when the plating is started.

An embodiment of a plating method will now be described with reference to the flow chart shown in FIG. 11. In step 1, correlation data on a relationship between the chloride ion concentration in a plating solution and the proportion of dome height to bump height, as shown in FIG. 4, is prepared. The correlation data can be prepared from past experimental results. The correlation data may be a data table that shows the relationship between the chloride ion concentration and the above-described proportion, or a function that shows the relationship between the chloride ion concentration and the above-described proportion. The correlation data is stored in a not-shown storage device of the plating apparatus.

In step 2, a concentration of chloride ions to be contained in the plating solution is selected by a not-shown controller based on a desired proportion of dome height to bump height and on the correlation data stored in the storage device. More specifically, a chloride ion concentration which can achieve the desired proportion is selected based on the correlation data. As described above, the selected chloride ion concentration is within the range of 100 mg/dm$^3$ to 300 mg/dm$^3$.

In step 3, a plating solution containing chloride ions at the selected concentration is produced. In addition to chloride ions, the plating solution contains copper ions and sulfate ions, and further contains additives, such as an accelerator and a suppressor. In step 4, a substrate, held by the substrate holder 24 (see FIG. 1), is immersed in the plating solution. In step 5, the substrate is plated by passing an electric current between the anode 26 (see FIG. 1) and the substrate, both immersed in the plating solution, while reciprocating the paddle 32. During plating of the substrate, the paddle 32 (see FIG. 1) reciprocates at a preset reciprocating speed (the number of reciprocations per minute). Owing to the effect of diffusing the plating solution in the vicinity of the substrate, produced by the reciprocation of the paddle 32, the plating solution can sufficiently reach the bottoms of vias of the substrate even when the vias have high aspect ratio. Plating of the substrate is performed until the height of bumps reaches at least 100 μm. In step 6, plating of the substrate is terminated upon elapse of a preset plating time.

Figure 11:
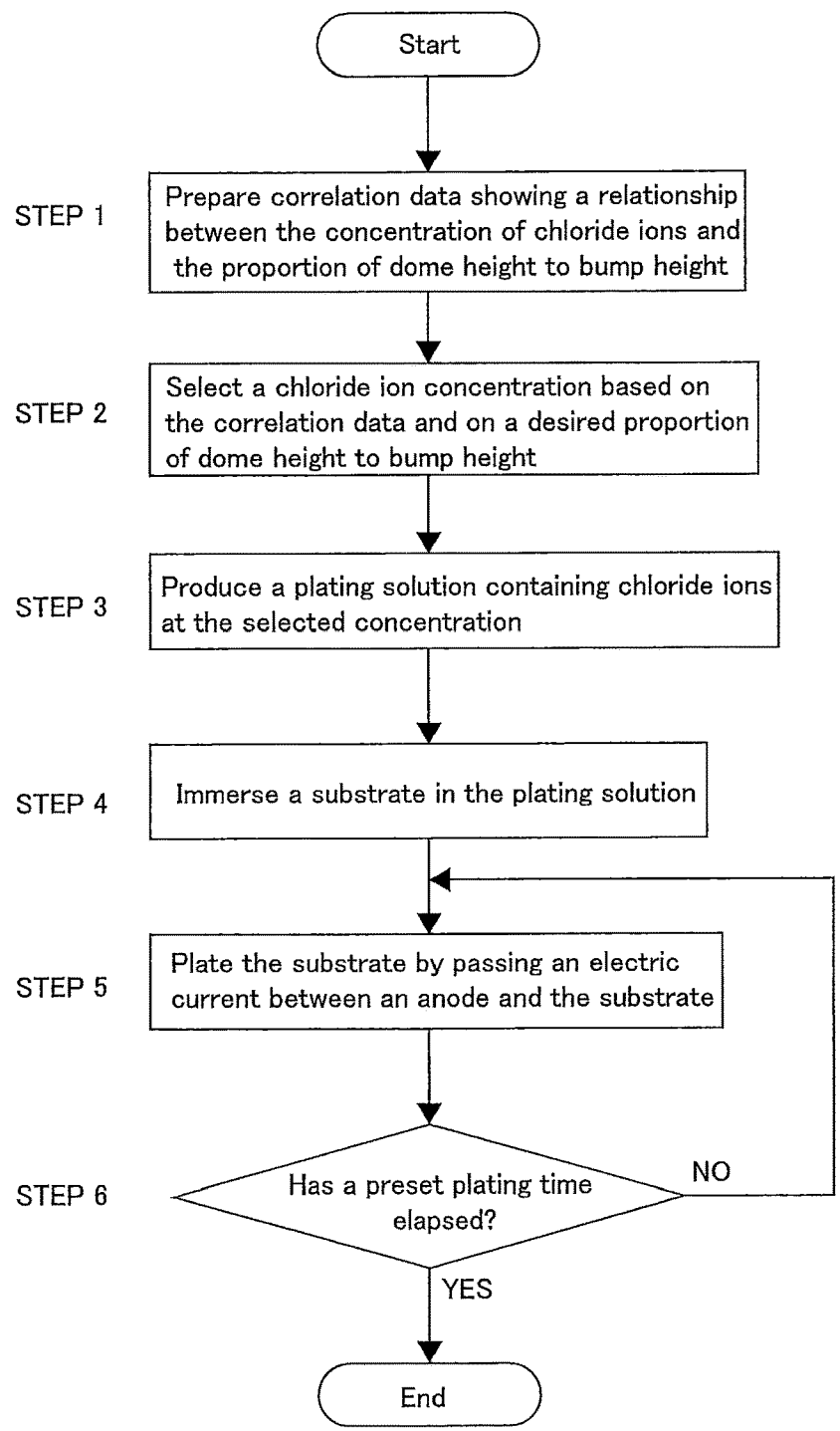
FIG. 11 is a flow chart illustrating an embodiment of a plating method.
Figure 12:
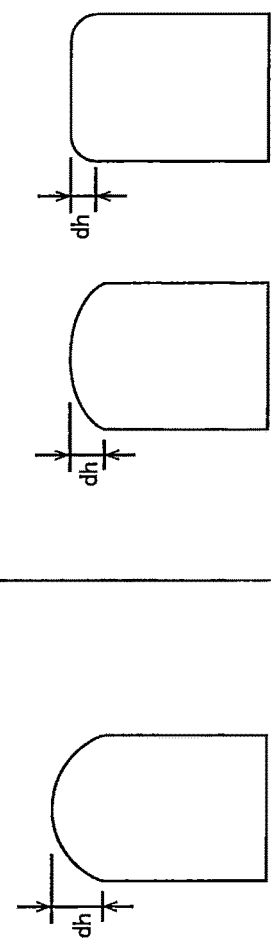
FIG. 12 is a diagram showing plating conditions in an experiment conducted in accordance with the embodiment shown in FIG. 11, and plating conditions in an experiment conducted as a comparative example.

FIG. 12 is a diagram showing plating conditions in an experiment conducted in accordance with the embodiment shown in FIG. 11, and plating conditions in an experiment conducted as a comparative example. In the experiment conducted as a comparative example, a temperature of a plating solution during plating was 30° C., the reciprocating speed of the paddle 32 was 250 times/min, the plating time was about 4 hours, the average current density was 4 A/dm$^2$, and the chloride ion concentration was 50 mg/dm$^3$. In this experiment, the dome height was too high due to the influence of the bump height; a desired dome height was not able to be achieved.

In the experiment conducted in accordance with the embodiment, a temperature of a plating solution during plating was 45° C., the reciprocating speed of the paddle 32 was 375 times/min, the plating time was about 1 hour, the average current density was 14.5 A/dm$^2$, and the chloride ion concentration was 100 mg/dm$^3$ or 300 mg/dm$^3$. In this experiment, a desired dome height was able to be obtained by adjusting the chloride ion concentration.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method of plating a substrate with copper to form bumps, comprising:
   preparing correlation data showing a relationship between proportion of dome height to bump height and concentration of chloride ions;
   producing a plating solution containing chloride ions at a concentration which has been selected based on a desired proportion of dome height to bump height and on the correlation data, the selected concentration being in a range of 100 mg/dm$^3$ to 300 mg/dm$^3$;
   immersing a substrate in the plating solution, the substrate having a seed layer and a resist covering the seed layer, the resist having openings, side walls of the openings being formed by the resist, bottoms of the openings being formed by the seed layer; and
   passing an electric current between an anode and the substrate, both immersed in the plating solution, thereby plating the substrate to form bumps in the openings, wherein the bumps comprise a dome having a top portion with an inwardly curved side surface.

2. The method according to claim 1, wherein plating of the substrate is performed until a height of the bumps reaches at least 100 μm.

3. The method according to claim 1, wherein a current density is increased at a start of plating of the substrate.

4. The method according to claim 3, wherein the current density is in a range of 1 A/dm$^2$ to 20 A/dm$^2$.

5. The method according to claim 1, wherein a temperature of the plating solution is maintained in a range of 30° C. to 80° C. during plating of the substrate.

6. The method according to claim 1, wherein the plating solution is agitated by reciprocating a paddle in the plating solution at a reciprocating speed of 100 times/min to 500 times/min during plating of the substrate.

7. The method according to claim 1, wherein the correlation data is stored in a storage device of a plating apparatus for forming the bumps.

* * * * *